United States Patent [19]
Williams

[11] Patent Number: 6,089,525
[45] Date of Patent: Jul. 18, 2000

[54] SIX AXIS ACTIVE VIBRATION ISOLATION AND PAYLOAD REACTION FORCE COMPENSATION SYSTEM

[75] Inventor: Mark Williams, Pelham, N.H.

[73] Assignee: Ultratech Stepper, Inc., San Jose, Calif.

[21] Appl. No.: 08/946,457

[22] Filed: Oct. 7, 1997

[51] Int. Cl.⁷ .................................................. F16M 13/00
[52] U.S. Cl. ........................ 248/550; 248/562; 248/636; 248/638; 702/56
[58] Field of Search .............................. 73/662, 663, 664, 73/665; 248/550, 562, 563, 636, 638, 188.2, 559; 364/528.15; 702/56

[56] References Cited

U.S. PATENT DOCUMENTS

| | | | |
|---|---|---|---|
| Re. 32,931 | 5/1989 | Staudte | 73/505 |
| 3,991,863 | 11/1976 | Lee | 188/289 |
| 4,472,824 | 9/1984 | Buckley | 378/34 |
| 4,507,597 | 3/1985 | Trost | 318/653 |
| 4,524,619 | 6/1985 | Staudte | 73/505 |
| 4,545,683 | 10/1985 | Markle | 356/400 |
| 4,547,446 | 10/1985 | Tam | 430/22 |
| 4,703,166 | 10/1987 | Bruning | 250/201 |
| 4,730,541 | 3/1988 | Greene | 248/550 |
| 4,746,800 | 5/1988 | Van Eijk et al. | 250/442.1 |
| 4,768,065 | 8/1988 | Wells, II | 355/43 |
| 4,785,192 | 11/1988 | Bruning | 250/548 |
| 4,899,587 | 2/1990 | Staudte | 73/505 |
| 4,934,884 | 6/1990 | Rooke | 411/8 |
| 4,941,265 | 7/1990 | Heiland | 33/504 |
| 5,170,104 | 12/1992 | Laughlin | 318/135 |
| 5,260,580 | 11/1993 | Itoh et al. | 250/492.2 |
| 5,285,142 | 2/1994 | Galburt et al. | 318/640 |
| 5,285,995 | 2/1994 | Gonzalez et al. | 248/550 |
| 5,504,407 | 4/1996 | Wakui et al. | 318/568.17 |
| 5,653,317 | 8/1997 | Wakui | 248/550 |
| 5,693,990 | 12/1997 | Miyazaki | 248/550 |
| 5,750,897 | 5/1998 | Kato | 248/550 |
| 5,812,420 | 9/1998 | Takahashi | 248/550 |

OTHER PUBLICATIONS

Beard, A.M., et al. "*A Practical Product Implementation of an Active/Passive Vibration Isolation System,*" DE–vol. 75, Active Control of Vibration and Noise, ASME 1994, pp. 485–492.

*Primary Examiner*—Hezron Williams
*Assistant Examiner*—Rose M. Miller
*Attorney, Agent, or Firm*—Allston L. Jones

[57] ABSTRACT

An active vibration isolation and payload reaction force compensation system includes a number of isolation legs which support equipment subject to undesirable vibrations. Each leg includes an elastomeric support member which supports the mass of the equipment and attenuates seismic forces transmitted from the ground to the system. A number of force actuators fixed to each leg and to the equipment in oppositely directed pairs provide forces directed to compensate for motions of the equipment. Six accelerometers are provided on the equipment to measure accelerations in six degrees of freedom. A control system, responsive to signals from the accelerometers, causes actuation of the force actuators.

17 Claims, 7 Drawing Sheets

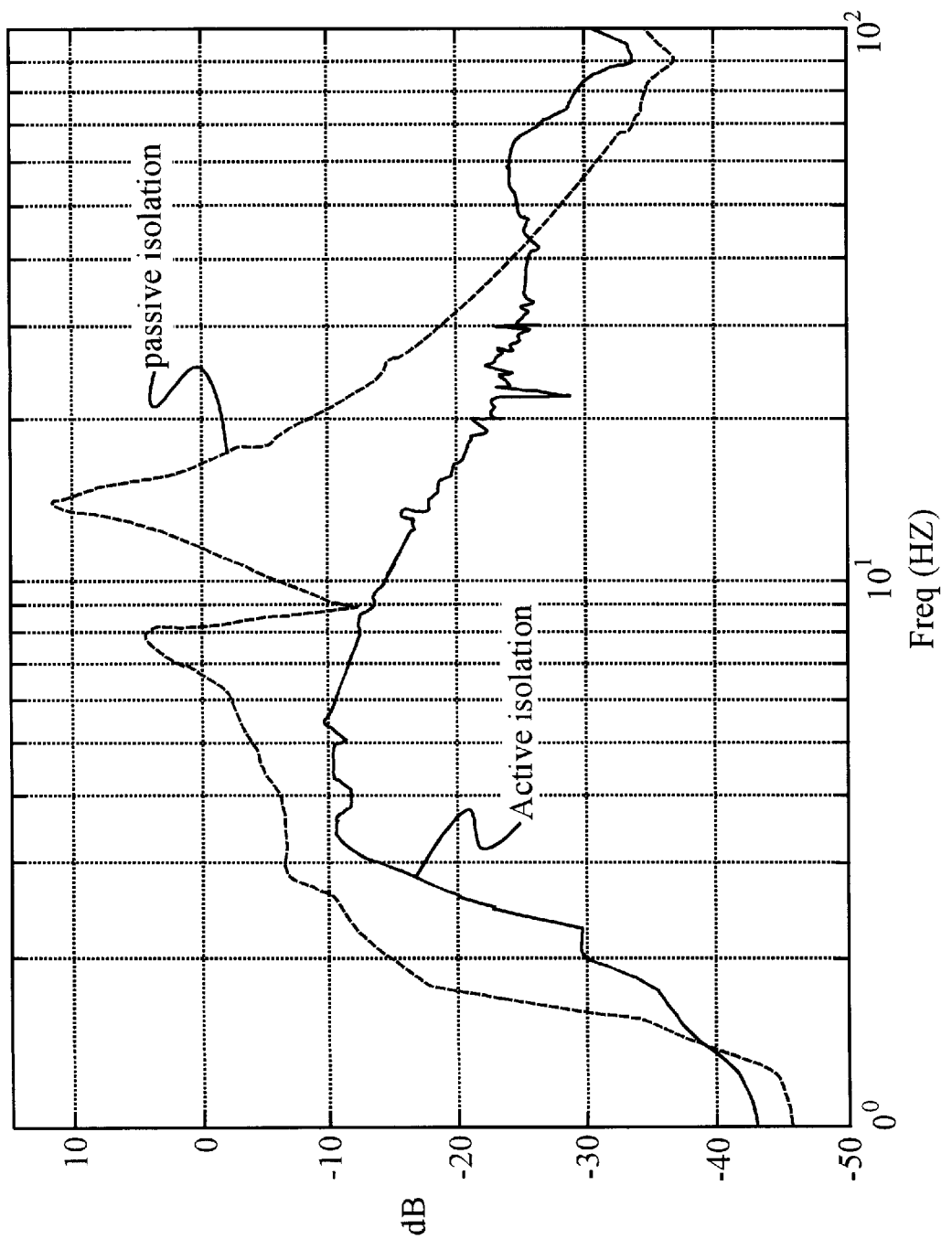
*Fig. 6 Vertical seismic transmissibility*

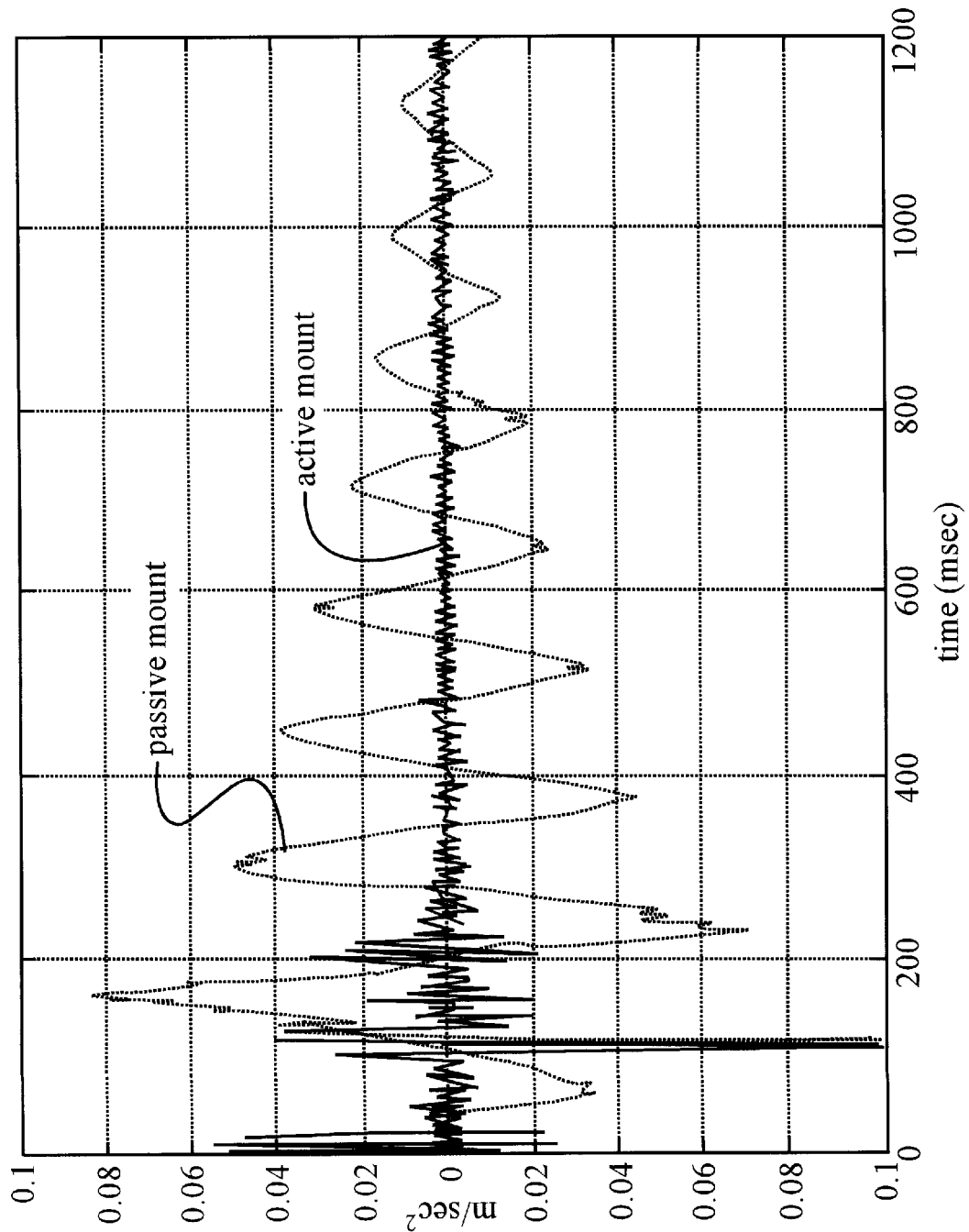
*Fig. 7 Payload disturbance force rejection*

SIX AXIS ACTIVE VIBRATION ISOLATION AND PAYLOAD REACTION FORCE COMPENSATION SYSTEM

CROSS REFERENCE TO RELATED APPLICATIONS

None.

STATEMENT REGARDING FEDERALLY SPONSORED RESEARCH OR DEVELOPMENT

N/A

BACKGROUND OF THE INVENTION

Photolithography equipment is used in the processing of semiconductor wafers. In this equipment, a wafer to be processed is placed on a stage or other support platform which is movable to align the wafer with respect to the photolithography equipment. Two sources of forces can disturb the alignment. The movement of the payload generates reaction forces which cause the stage to vibrate and move the lens assembly, potentially disturbing the alignment. Also, the vibrations can take substantial time to dissipate, and during this time, the wafer cannot be exposed. Additionally, seismic level base disturbances can affect the alignment. Typically, prior art stepper systems are isolated from seismic disturbances, whereas the stage motions are optimized to reduce reaction forces.

BRIEF SUMMARY OF THE INVENTION

The present invention provides an integrated active seismic isolation system with the additional capability of compensating for payload reaction forces in real time in six degrees of freedom. The system incorporates both passive and active elements to provide the isolation or control of disturbance forces within the frequency bandwidth of interest. The vibration induced by stage motions are deterministic in nature and are compensated for with feed forward techniques. During wafer exposure, the primary source of vibration is from seismic level base disturbances.

The present invention provides a number, preferably three or four, of isolation legs which support a stepper system. Each leg includes an elastomeric support member which supports the mass of the stepper system and attenuates seismic forces transmitted from the ground to the system. Thus this member forms the passive vibration isolation component of the system.

A number of force actuators are fixed to each leg and to the stepper system. The force actuators, which may or may not be disposed in oppositely directed pairs, each provide a force directed to compensate for motions of the stepper system. Six accelerometers are provided on the stepper system to measure accelerations in six degrees of freedom. A control system, responsive to signals from the accelerometers, causes actuation of the force actuators.

The force actuators are provided in sufficient numbers and at sufficient locations to ensure that sufficient forces can be generated to compensate for motions of the stepper system. In each isolation leg, two force actuators are disposed to provide vertical motion, one directed upwardly and one directed downwardly. In an embodiment having four isolation legs, generally disposed at four corners of the stepper system, eight horizontal force actuators are provided, each oriented to generate a force directed toward an opposed force actuator on an adjacent leg. In an embodiment having three isolation legs, six horizontal force actuators are provided, not necessarily in opposing pairs. In this manner, motions of the stepper system, detected by the accelerometers, can be compensated for.

BRIEF DESCRIPTION OF THE SEVERAL VIEWS OF THE DRAWING

The invention will be more fully understood from the following detailed description taken in conjunction with the accompanying drawings in which:

FIG. 6 is a graph illustrating vertical seismic transmissibility with and without the present invention; and FIG. 7 is a graph illustrating payload disturbance force rejection with and without the present invention.

DETAILED DESCRIPTION OF THE INVENTION

Figure 1:
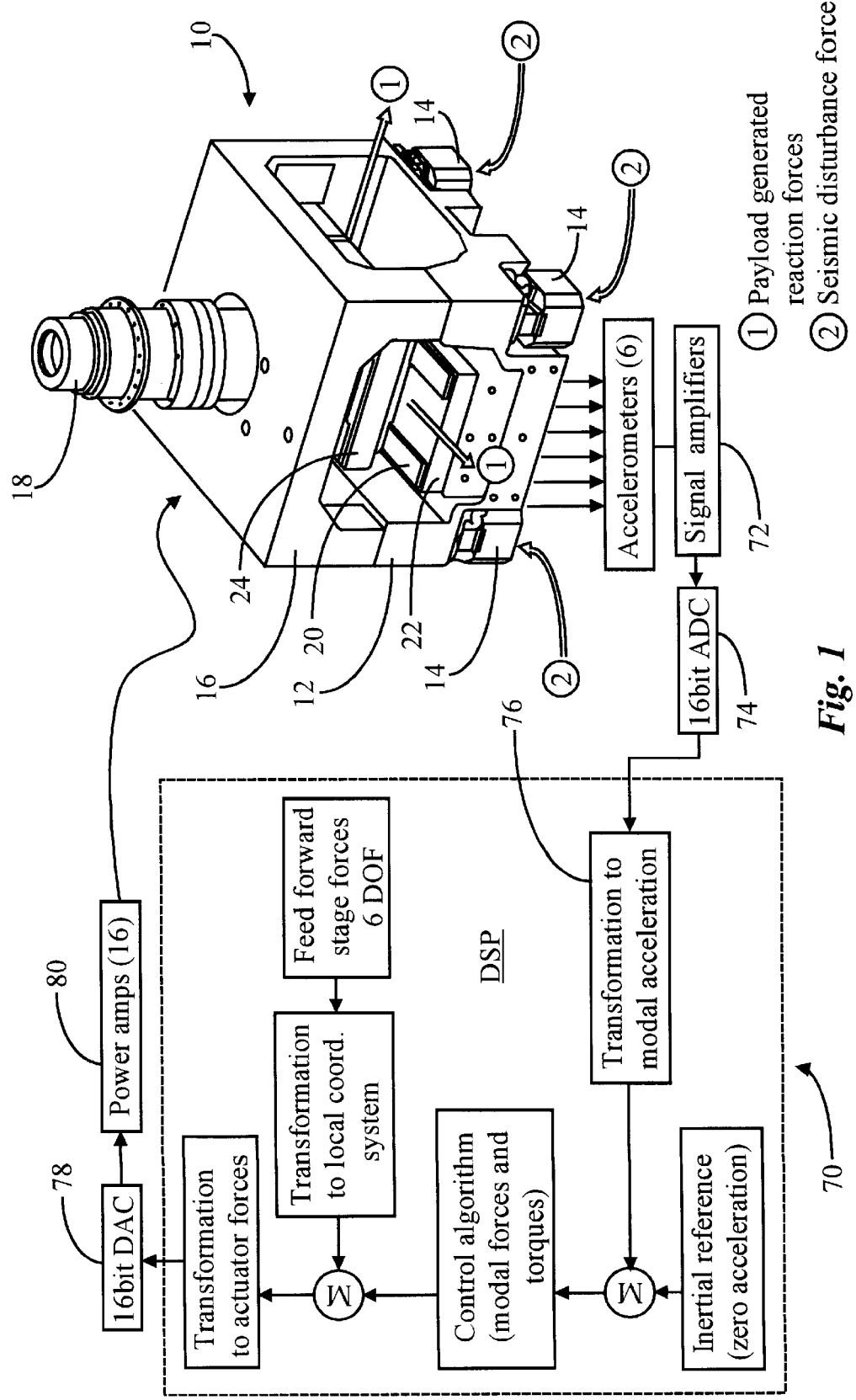
FIG. 1 is schematic diagram of a vibration isolation and payload reaction force compensation system according to the present invention.

A stepper system 10 incorporating the present invention is illustrated in FIG. 1. The system includes a base 12, supported on the ground by a number of isolation legs 14. A bridge 16 is mounted over the base. A lens assembly 18 extends through an opening in the bridge to expose a wafer. A wafer to be processed is placed on a stage assembly 20, which is supported on the stepper base. The stage assembly includes two orthogonal coarse stages 22, 24 for large motions in two degrees of freedom along two orthogonal axes, typically on the order of 8 inches, the diameter of a wafer. The stage assembly also includes a fine stage (not visible) for finer motions in six degrees of freedom. The stages allow a wafer on the stage assembly to be appropriately aligned with respect to the lens assembly.

Figure 2:
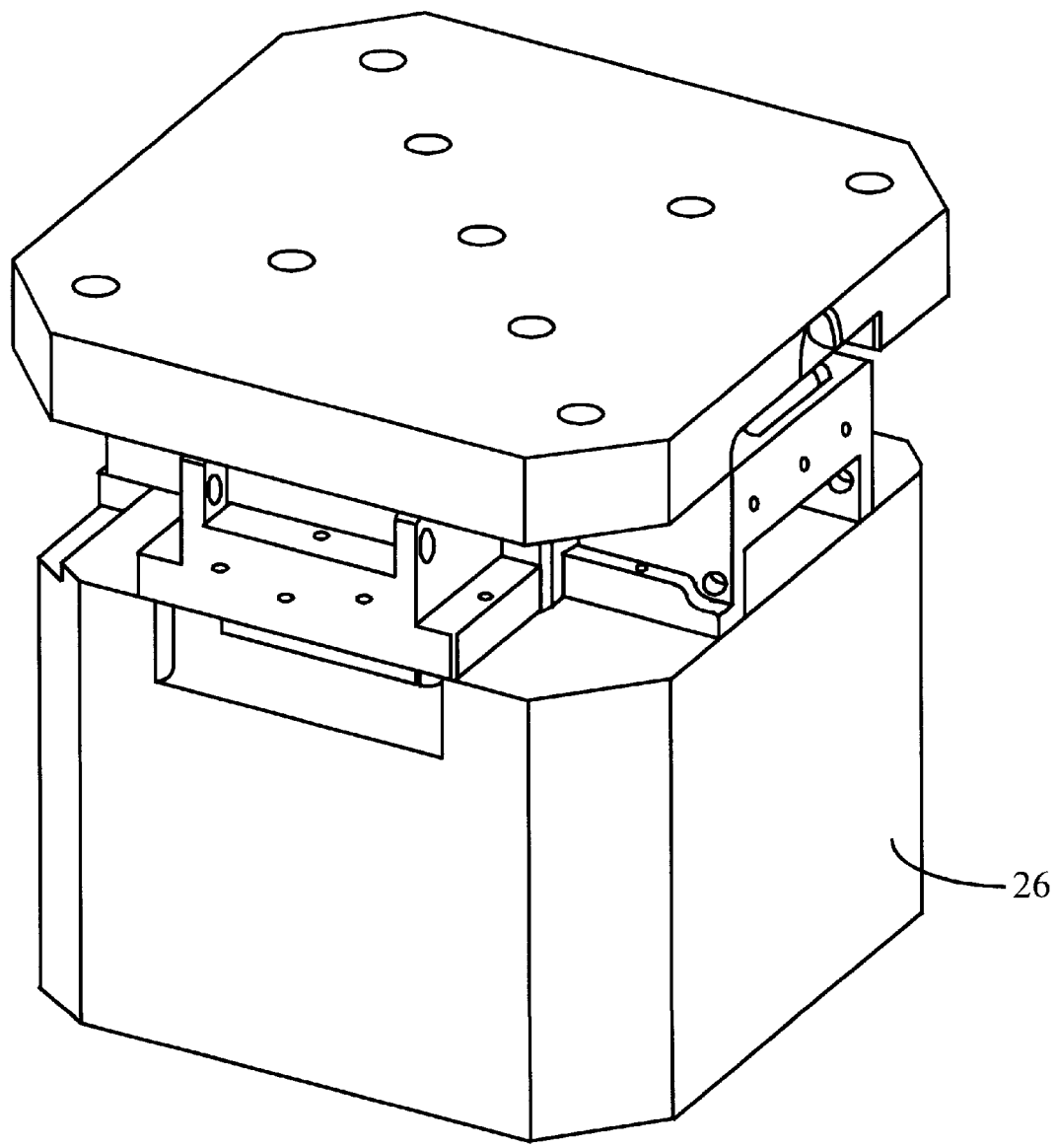
FIG. 2 is an isometric view of an isolation leg of the system of FIG. 1.
Figure 3:
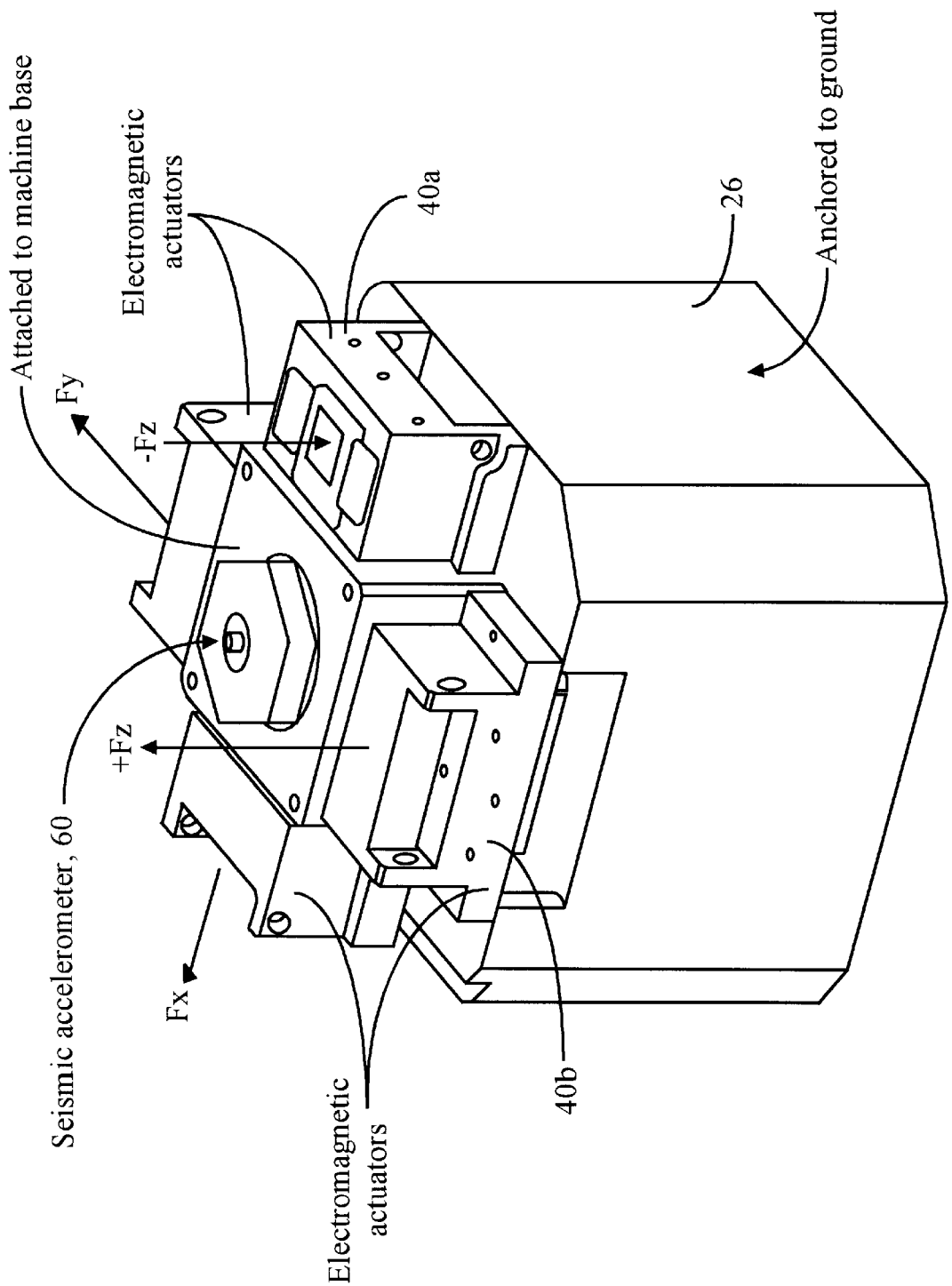
FIG. 3 is an isometric view of the isolation leg of FIG. 2 with a top plate thereof removed.
Figure 4:
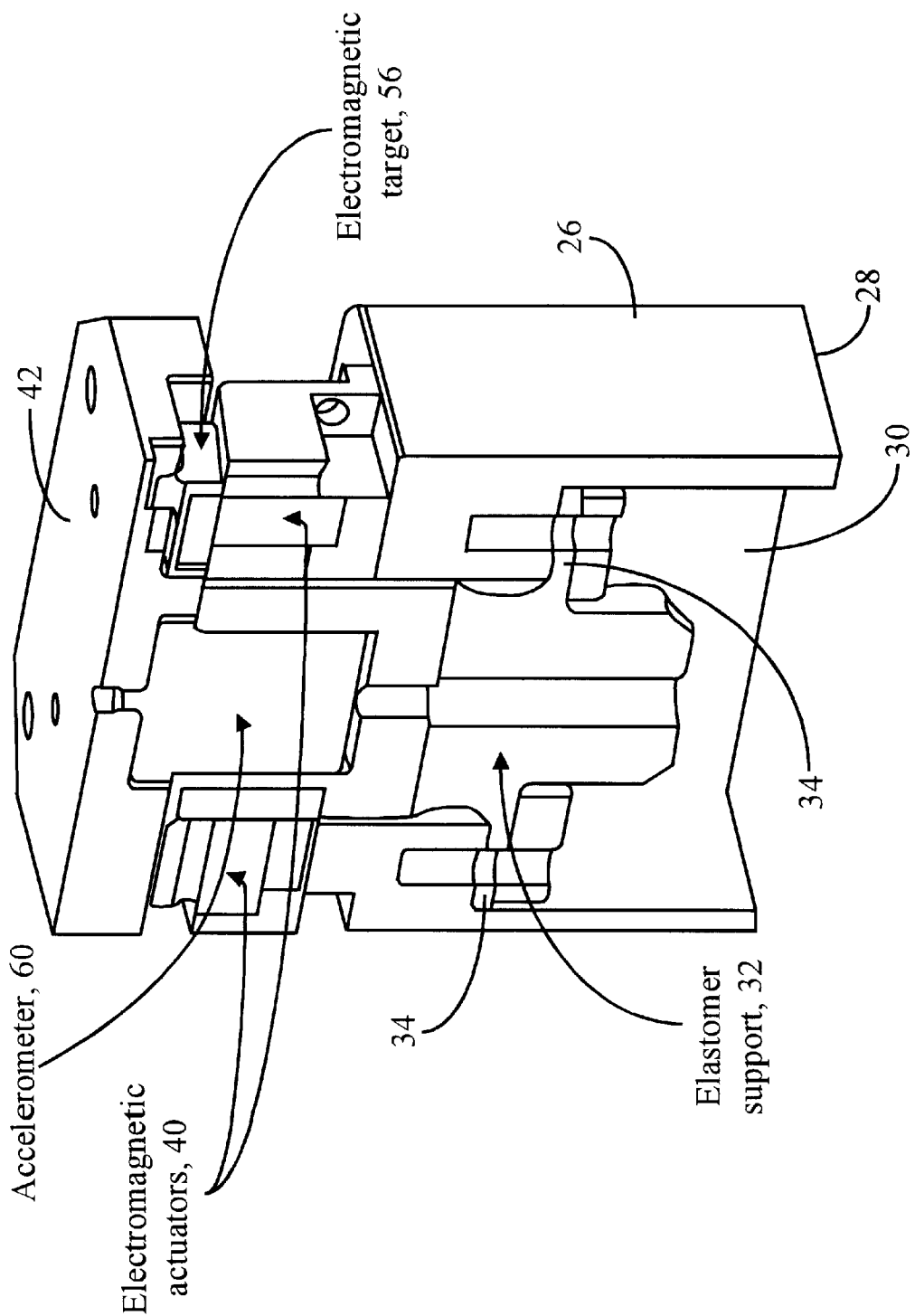
FIG. 4 is a cross-sectional isometric view of the isolation leg of FIG. 2.

Referring to FIGS. 2–4, each isolation leg 14 comprises a housing 26 or support which rests on the ground or floor. An elastomeric material 28 may be provided in a thin layer between the bottom surface of the housing and the ground to increase friction and prevent sliding of the housing on the ground. The housing includes an interior cavity 30 containing an elastomeric support member 32. The elastomeric support member is fixed to the housing in any suitable manner, such as by side flanges or extensions 34 which are bolted to the housing through holes in the flanges.

The elastomeric support member 32 is formed from a block of elastomeric material. It supports the mass of the stepper system and forms the passive vibration isolation component of the system to isolate the stage assembly from seismic disturbance forces. The shape of the elastomeric support member is chosen so that the horizontal and vertical stiffness of the elastomer is balanced. In this way, seismic forces transmitted from the ground to the housing are attenuated by the elastomeric member.

A number of force actuators 40 are fixed to the top of the housing 26 in each leg. The force actuators are also fixed to a top plate 42 which is in turn fixed to the base of the stepper system. Each actuator provide force in a single direction.

Thus, in the case of four legs, two actuators disposed in opposed pairs are needed to provide a bipolar force.

In the embodiment shown in FIG. 1, four isolation legs 14 are provided, one at each of the four corners of the stepper system. Within each leg, two force actuators 40a, 40b are disposed to provide vertically directed forces, one directed upwardly and one directed downwardly (indicated by arrows $+F_z$ and $-F_z$ in FIG. 3), and two force actuators 40c, 40d are disposed to provide horizontal motion (indicated by arrows $F_x$ and $F_y$ in FIG. 3). The horizontal force actuators within each leg are oriented at right angles to each other. The horizontal force actuators 40c, 40d each thereby provide a force directed along a side of the stepper system toward an opposing force actuator on the leg at the adjacent corner. Thus, a total of eight horizontal force actuators and eight vertical force actuators are provided, with the vertical force actuator pairs disposed within each leg and the horizontal force actuator pairs distributed among legs on adjacent corners. The actuators are symmetrically placed and are sized large enough to provide sufficient force to compensate for any stage reaction forces.

Figure 5:
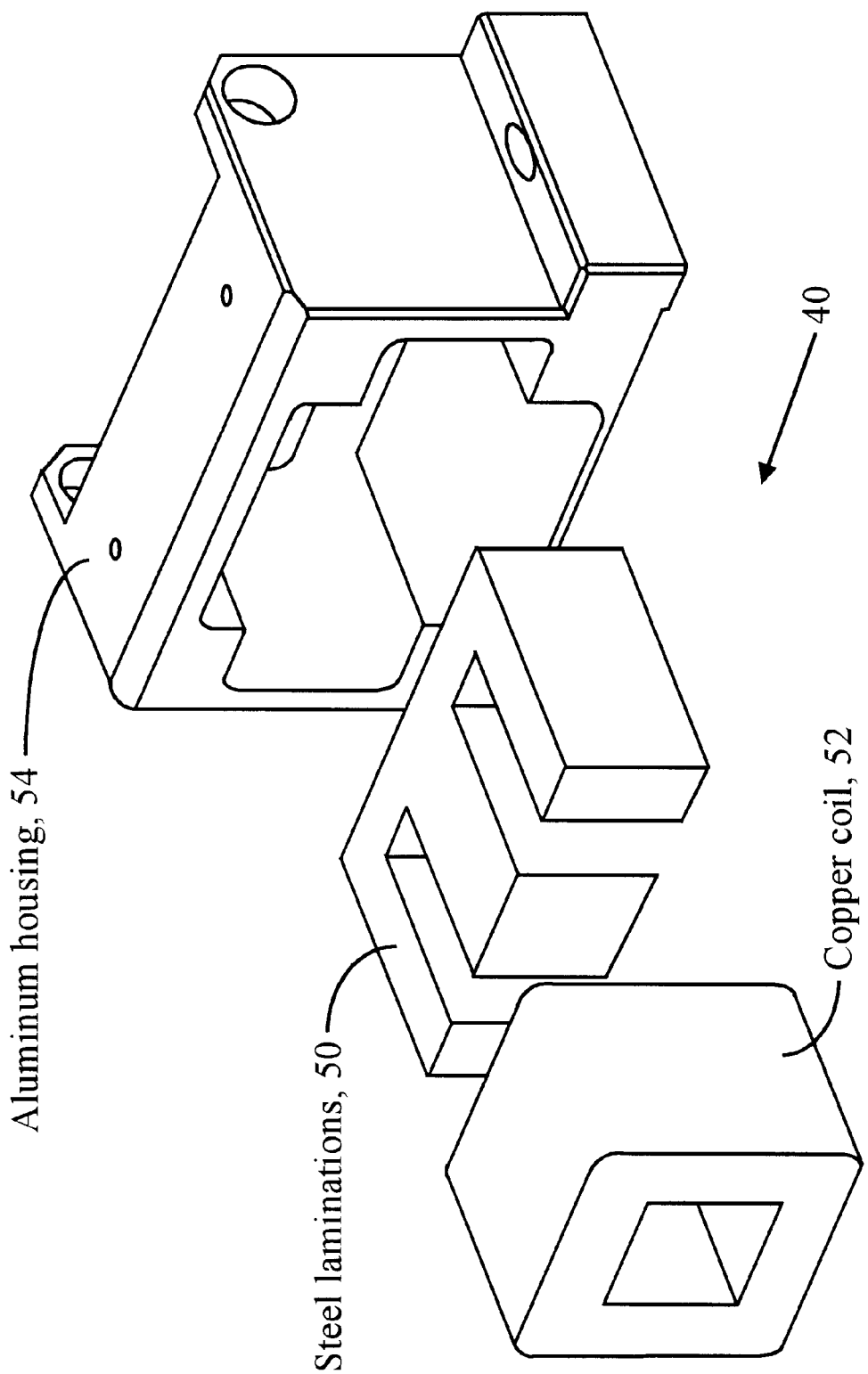
FIG. 5 is an exploded view of a force actuator according to the present invention.

In the preferred embodiment, the force actuators are variable reluctance tractive type force actuators selected to have a high specific force and relatively large stroke. Each actuator 40 comprises a number of steel laminations 50 in the shape of an E with a copper coil 52 disposed about the middle leg of the E (FIG. 5) and an associated electromagnetic target 56 (FIG. 4). An aluminum housing 54 is provided around the steel laminations with suitable flanges for mounting to the top plate and the housing of each leg. Each actuator is oriented to generate a force in the desired direction. The actuator halves can be fixed to the isolation leg and to the stepper system respectively in any suitable manner to achieve the desired force and direction. It will be appreciated that other types of force actuators could be used, depending on the size and configuration constraints of the system.

Six accelerometers 60 are also fixed to the top plate to measure accelerations of the stepper base in six degrees of freedom. Three accelerometers are oriented horizontally and measure linear accelerations along the X and Y axes and angular accelerations about the Z axis respectively, the X, Y, and Z axes being orthogonal to each other. The other three accelerometers are oriented vertically and measure linear accelerations along the Z axis and angular accelerations about the X and Y axes respectively. Signals representative of the measured accelerations are transmitted to a controller. In the embodiment illustrated, two accelerometers are provided at each of three of the legs. However, the accelerometers could be fixed to the stepper system at locations other than within the legs, if desired. Any suitable accelerometer within an appropriate frequency range can be used.

A control system 70 is provided to actively control payload disturbance forces by actuation of the force actuators 40 in response to accelerations sensed by the accelerometers 60. Signals from the six accelerometers are transmitted via signal amplifiers 72 to an analog to digital converter 74. In a digital signal processor 76, the signals are transformed to modal acceleration and subtracted from an inertial reference. A control algorithm calculates the modal forces and torques. To take into account known stage motions, the modal forces and torques are summed with feed forward stage forces and then transformed to actuator forces. Signals representative of the actuator forces are converted to analog by digital to analog converter 78, amplified by amplifiers 80, and transmitted to the force actuators in the legs to accelerate the stepper system in the appropriate manner that cancels detected accelerations.

The control algorithm is based on a model of the stepper system as a rigid body having six degrees of freedom supported by a series of well damped vertical and horizontal springs. This assumption is valid since the elastic modes of the stepper system are all beyond the active control bandwidth. The control algorithm is designed to reduce the transmissibility at lower frequencies (a decade below the resonant frequency), suppress the resonant peak at the natural frequency of the mount, and join the passive transmissibility of the mount about a decade greater than the resonant frequency.

FIG. 6 illustrates the vertical seismic transmissibility of the system with and without active isolation. Resonance and the resulting amplification of base vibrations are apparent at some frequencies within the bandwidth when passive isolation alone is used, indicated by the dashed curve. With active isolation, provided by actuating the force actuators to compensate for the accelerations of the base, the base vibrations are attenuated over the entire control bandwidth, indicated by the solid curve.

FIG. 7 illustrates the system's ability to reject payload generated reaction forces. Oscillation of the stepper, without active control, due to acceleration in the X direction during a 20 mm step of the wafer stage is indicated by the dashed curve. As can be seen, the stepper oscillates at the natural frequency of the passive mount for approximately 1.5 seconds. With active control, however, the reaction forces are transferred to earth and the stepper acceleration decays almost immediately after the stage motion ceases, as indicated by the solid curve.

Although four isolation legs are shown in FIG. 1, three legs could be used as well. Preferably in such a case, the legs form the corners of a generally equilateral triangle and are located closer to the plane passing through the center of gravity of the stepper system. Two horizontal force actuators are provided at each leg. The six actuators are still located to direct horizontal forces axially with respect to the X and Y axes and orthogonal to each other. Since the forces are no longer in opposed bipolar pairs, however, accommodations are made in the control algorithm to properly proportion the forces. Two vertical force actuators are also provided at each leg to provide a pair of vertical forces. These force are sufficient to provide control in six degrees of freedom.

Although described in conjunction with a stepper system for semiconductor wafer processing, the invention is applicable to other types of equipment which require vibration isolation. The invention is not to be limited by what has been particularly shown and described, except as indicated by the appended claims.

I claim:

1. A vibration isolation and payload reaction force compensation system comprising:
   a base having a movable payload supporting assembly; and
   a plurality of isolation legs disposed to support said base on a ground surface, each isolation leg comprising:
      a housing disposed to contact said ground surface, and
      an elastomeric support member having balanced horizontal and vertical stiffness coupled to said housing and disposed to support and isolate said base from direct contact with said housing, and to attenuate seismic forces transmitted from said ground in all directions.

2. The system of claim 1, wherein:
   each of said isolation legs further includes a plurality of force actuators disposed between said housing and said base to compensate for motions of said base in response to control signals; and said system further includes a control system in communication with said plurality of force actuators to generate said control signals to cause actuation of said plurality of force actuators.

3. The system of claim 1, wherein said system further includes a plurality of accelerometers in communication with, and disposed to detect accelerations of, said base.

4. The system of claim 3, wherein said plurality of accelerometers detect accelerations in six degrees of freedom.

5. The system of claim 2, wherein said system further includes a plurality of accelerometers in communication with, and disposed to detect accelerations of, said base.

6. The system of claim 5, wherein said plurality of accelerometers are disposed to detect accelerations of said base in six degrees of freedom.

7. The system of claim 5, wherein said plurality of accelerometers are coupled to said control system to provide acceleration information for the generation of said control signals.

8. The system of claim 5, wherein said plurality of accelerometers comprise six accelerometers disposed to detect linear accelerations along three orthogonal axes and angular accelerations about said three orthogonal axes.

9. The system of claim 2, wherein each of said plurality of force actuators are non-contact, tractive type actuators.

10. The system of claim 2, wherein said plurality of force actuators are provided in pairs with each providing oppositely directed forces.

11. The system of claim 10, wherein there are three pairs of force actuators, with a different pair of force actuators oriented in each of said x, y and z axis.

12. The system of claim 9, wherein each force actuator comprises a variable reluctance tractive type force actuator.

13. An isolation leg for use with a vibration isolation and payload reaction force compensation system having a base with a movable payload supporting assembly and a plurality of isolation legs disposed to support said base on a ground surface, each isolation leg comprising:

a housing disposed to contact said ground surface; and an elastomeric support member having balanced horizontal and vertical stiffness coupled to said housing and disposed to support and isolate said base from direct contact with said housing, and to attenuate seismic forces transmitted from said ground in all directions.

14. The isolation leg of claim 13, further comprising a plurality of force actuators disposed between said housing and said base to compensate for motions of said base in response to control signals.

15. The isolation leg of claim 14, wherein each of said plurality of force actuators are non-contact, tractive type actuators.

16. The isolation leg of claim 14, wherein said plurality of force actuators are provided in pairs with each providing oppositely directed forces.

17. The isolation leg of claim 15, wherein each force actuator comprises a variable reluctance tractive type force actuator.

* * * * *